(12) United States Patent
Hotchkiss

(10) Patent No.: US 6,809,545 B2
(45) Date of Patent: Oct. 26, 2004

(54) PROGRAMMABLE POWER ADJUST FOR MICROELECTRONIC DEVICES

(75) Inventor: Loren Christien Hotchkiss, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/325,059

(22) Filed: Dec. 20, 2002

(65) Prior Publication Data
US 2004/0119494 A1 Jun. 24, 2004

(51) Int. Cl.[7] .............................................. H03K 19/00
(52) U.S. Cl. .......................... 326/16; 326/13; 326/113; 714/724
(58) Field of Search ............................ 326/13, 16, 113; 714/724–727

(56) References Cited

U.S. PATENT DOCUMENTS

| | | | | |
|---|---|---|---|---|
| 5,568,061 A | * | 10/1996 | McClure | 326/13 |
| 6,037,798 A | * | 3/2000 | Hedberg | 326/30 |
| 6,256,760 B1 | * | 7/2001 | Carron et al. | 714/726 |
| 6,532,557 B1 | * | 3/2003 | Wong et al. | 714/724 |
| 6,535,831 B1 | * | 3/2003 | Hudson et al. | 702/124 |
| 6,574,760 B1 | * | 6/2003 | Mydill | 714/724 |

* cited by examiner

Primary Examiner—Vibol Tan
(74) Attorney, Agent, or Firm—Marger Johnson & McCollom, P.C.

(57) ABSTRACT

A circuit to adjust power is disclosed. The circuit comprises at least one pass gate and a power adjustor electrically coupled to each pass gate such that the power adjustor consumes power when the gate is enabled. The power adjustor consumes power or not depending upon the state of a polyfuse within the power adjustor.

16 Claims, 8 Drawing Sheets

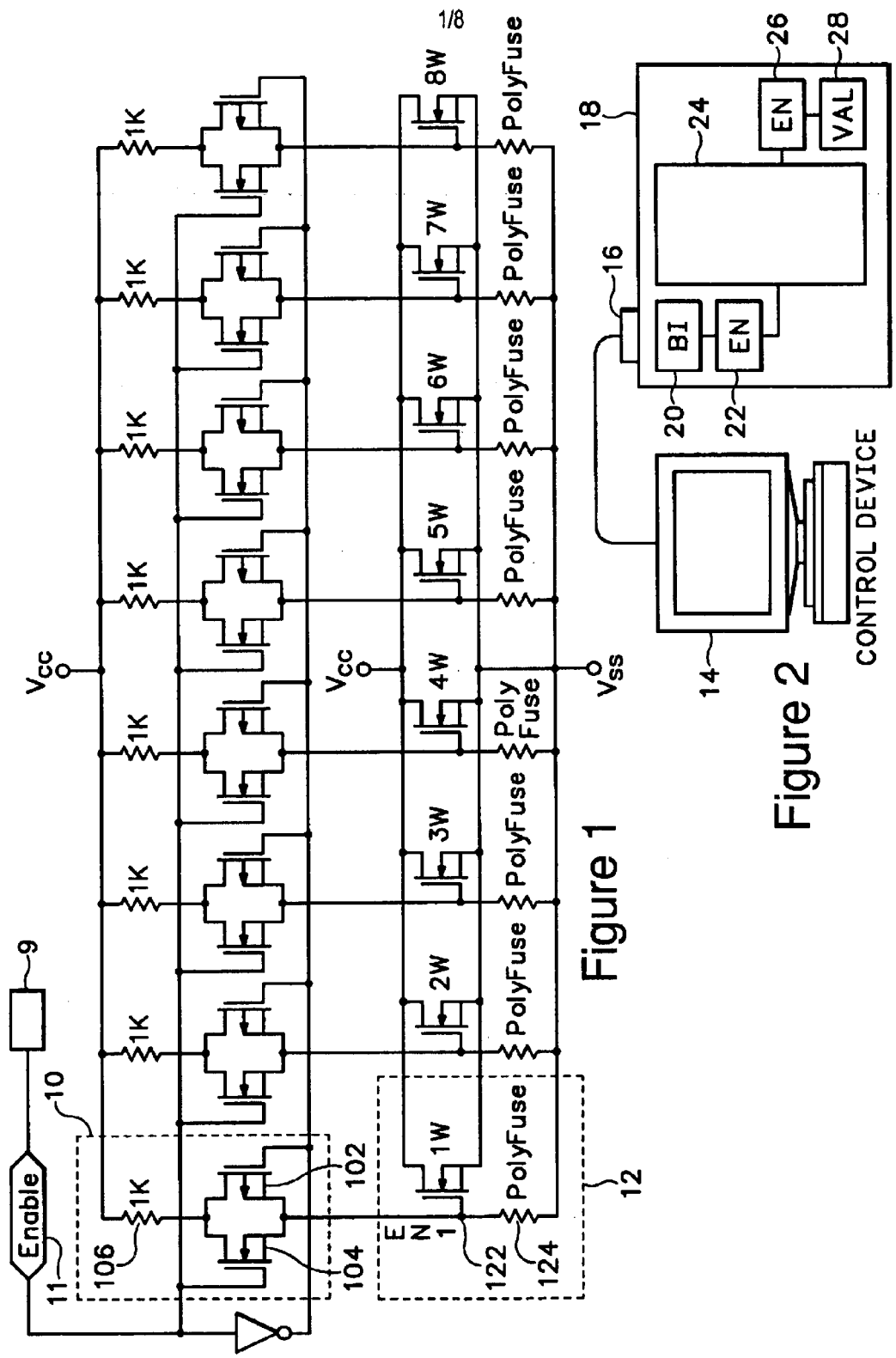

PROGRAMMABLE POWER ADJUST FOR MICROELECTRONIC DEVICES

BACKGROUND

Due to variances inherent in the microelectronic manufacturing process, devices manufactured by the same process and of the same type may have widely varying power consumption. This can lead to issues in burn-in processes and in platform validation tests.

For example, a typical burn-in process will sort the components to be cycled through burn-in by their power consumption. The devices at each power level are then burnt in separately from devices at other power levels. This requires either more time or more burn-in equipment, making the burn-in process less efficient. In addition, lower power devices have to be burnt in for longer periods of time, as they do not get to the higher temperatures that higher-powered devices reach.

Similarly, platform validation may suffer from a validation procedure run with a component that is at lower power consumption than what power consumption may be possible. For example, suppose a personal computer (PC) manufacturer receives a sample from a supplier that has a power consumption of 65 W during normal operation. The manufacturer then validates their platform at this power consumption. However, during production runs, the supplier may provide components that run as high as 75 W, which is the maximum power specified in the datasheet. This may cause problems for both the manufacturer and the supplier.

The manufacturer's platform may not perform as well as would be expected, because of the increased power requirement of the component, which also contributes to heat generation, another factor that degrades the performance of microelectronic devices. The manufacturer and supplier relationship may also suffer. The manufacturer, upon receiving the lower power device initially, may assume that the supplier's data sheet specifications for the device are incorrect. When the manufacturer's platforms start to fail due to a power requirement higher than the validation power, the manufacturer may hold the supplier responsible.

BRIEF DESCRIPTION OF THE DRAWINGS

Embodiments of the invention may be best understood by reading the disclosure with reference to the drawings, wherein:

FIG. 1 shows an embodiment of power adjustor circuit.

FIG. 2 shows an embodiment of a control system testing a microelectronic device having at least one power adjustor circuit.

DETAILED DESCRIPTION OF THE EMBODIMENTS

Figure 3A:
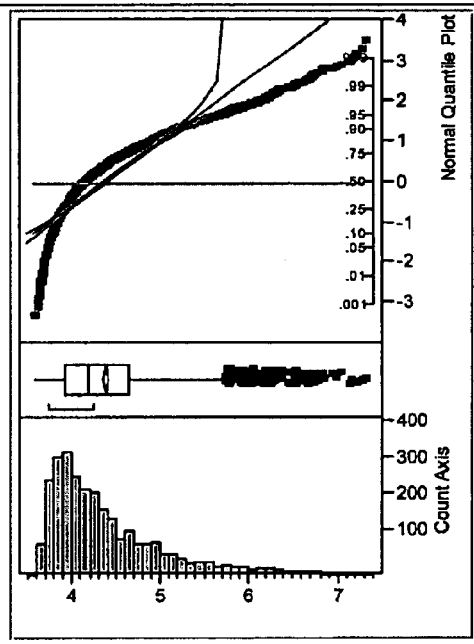
FIGS. 3a and 3b show simulated results of burn-in power prior to enabling a power adjustor and after enabling a power adjustor.

FIG. 1 shows an embodiment of a power adjustor circuit. Due to variations that exist in microelectronic manufacturing processes, some components may have variations in their power consumption. Employing embodiments of the power adjustor circuit, such as that shown in FIG. 1, the power distribution can be more tightly controlled. For example, the power distribution can be tightened to match the datasheet specifications for thermal and electrical validation of platforms using components upon which a power adjustor is employed. Similarly, the component may consume more power using the power adjustor circuit during burn-in. Power consumption raises the operational temperature of the component during burn-in, which in turn increases burn-in acceleration, thus reducing the necessary burn-in time to screen latent defects. Also, adjusting the power consumption allows devices of different non-burn-in power consumption profiles to be burned in simultaneously.

The embodiment of FIG. 1 shows a power adjustor circuit having several different power consumption levels. A pass gate 10 is enabled with an enable signal 11. The enable signal may originate from an enable register 9 that is programmed on the device for burn-in testing or for validation. When the pass gate 10 is enabled, the power adjustor circuit 12 consumes power proportional to the process technology for a device of width W in saturation mode. The width, W, may be adjusted for each silicon technology and product implementation to provide the level of power necessary to tighten power distributions. For example, a transistor of a width W may consume an amount of power of X Watts. The designer of the power adjuster circuit may narrow or widen the dimension W to consume less or more power. Each power adjustor circuit shown in FIG. 1 may be programmed to consume power to allow more flexible adjustment of power consumption.

For example, the power adjustor circuit itself is enabled by the enable signal 11. The term power adjustor circuit will be used to refer to one or more power adjustors being enabled by one enable signal. In the embodiment of FIG. 1, the pass gate comprising an NMOS transistor 104 and PMOS transistor 102 configured in a 'mirror' configuration, with their drains tied to Vss through the power adjustor 12, and their sources tied to Vcc by the pull up resistor 106. When the enable signal 11 is turned on, the gate of the NMOS transistor goes high and the NMOS transistor 104 closes the circuit and conducts. The inverse of the enable signal at the gate of the PMOS transistor 102 goes low, closing the circuit and conducting. This would normally cause the gate of the power adjustor transistor 122 to go high, but the gate of the power adjustor transistor 122 is tied to ground by the polyfuse resistor 124.

Whether each individual power adjustor circuit of a pass gate 10 and power adjustor 12 consumes power depends upon the state of the polyfuse 124. If the polyfuse 124 is blown, the resistance will change from approximately 100 ohms to approximately 1 Kohm. This results in a balanced voltage divider, resulting in a gate voltage of Vcc/2 for the transistor 122. This causes the transistor to stabilize in saturation mode and consume power proportional to the width W, as discussed above.

The adjustment of how much power a particular power adjustor circuit consumes depends upon the number of available and the number of blown polyfuses. The embodiment of FIG. 1 shows a power adjustor circuit of 8 power adjustors and their corresponding pass gates. However, a power adjustor circuit could have as many power adjustors and pass gates as the designer desires and as few as one. The number of power adjustors in the circuit will depend upon the technology being used for that component and the normal variation of power consumption for that technology.

If the desire were to adjust the power consumption by 4 W, blowing the polyfuses would activate the first four elements 1 W–4 W. This particular embodiment has the possibility of consuming an amount of power up to 8 W.

As discussed above, the power adjustor circuit may be used to tighten the power distribution for components used in platform validations or it may be used to increase the power consumption of components during burn-in test. Embodiments of the invention may have one power adjustor circuit for burn-in and a separate one for validation, or just one power adjustor circuit for either burn-in or validation. For example, a component manufactured during a production run may not be used for validation and would therefore require only the burn-in power adjustor circuit.

The component undergoing burn-in testing or validation will be referred to as a device under test. FIG. 2 shows a control system in which a component is undergoing test. The control device 14, such as a workstation or lab equipment, is connected to the device under test 18, typically by some sort of connector 16, although the component may be one of an array of devices undergoing test and therefore mounted in a testing platform. The component 18 has an active area 24, in which the circuitry for that component resides. For example, for a microprocessor, the transistors, memory, etc., for the microprocessor functions would be in the active area 24.

In addition, there would be two registers or fuses, one to enable the burn-in power adjustment circuit and one to enable the validation power adjustment circuit used for platform validation. The two enable registers or fuses or other means of originating an enable signal 22 and 26 are shown as being separate components from the active area. However, they may also be included in the active area, such as a flag bit set by the microprocessor upon executing a burn-in or validation instruction. The two power adjustment circuits, burn-in 20 and validation 28, would then be enabled as needed for the given testing function.

Figure 3B:
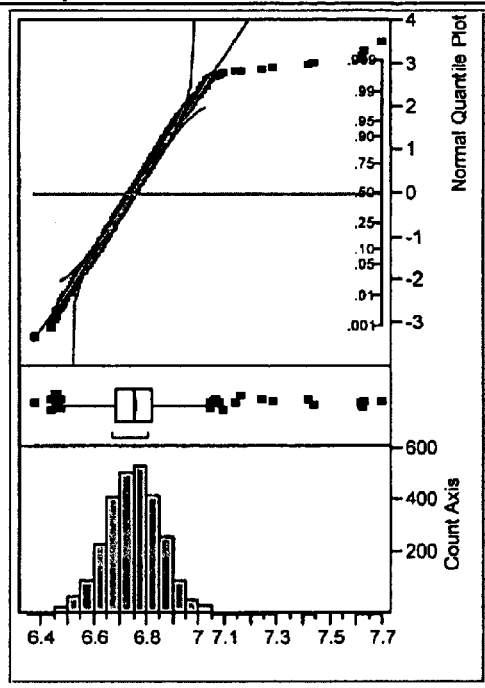

FIGS. 3a and 3b show simulated results for burn-in power consumption prior to enabling a power adjustor circuit and after enabling the circuit, respectively. As can be seen in FIG. 3a, the power distribution mean and sigma is 4.18 W and 0.64 W, respectively. In FIG. 3b, the actual distribution is much tighter to the ideal, with a mean of 6.76 W and standard deviation 0.11 W. The tighter the burn-in power distribution, the more controlled the burn-in temperature will be. This will result in a more controlled, cost-effective and higher quality burn-in process.

Figure 4A:
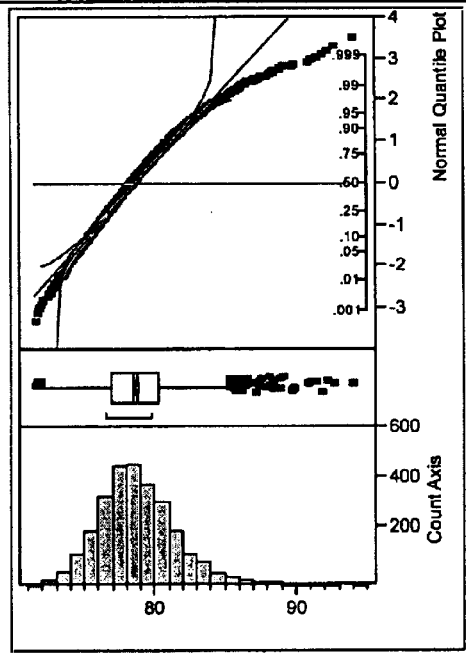
FIGS. 4a and 4b show simulated results of burn-in junction temperature distribution prior to enabling a power adjustor and after enabling a power adjustor.
Figure 4B:
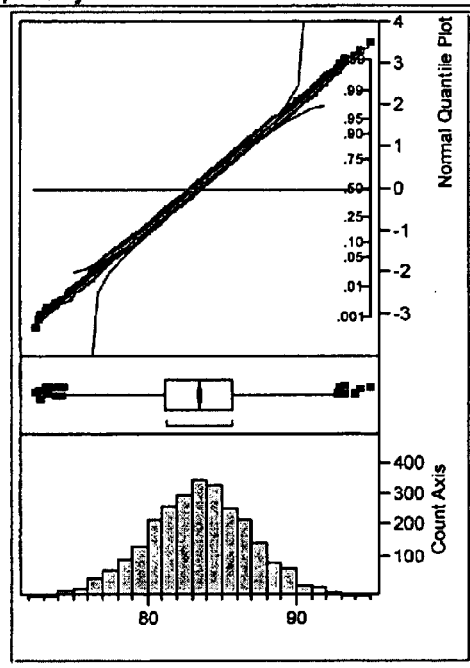

FIGS. 4a and 4b show simulated results if prior to enabling the circuit and after enabling the circuit for burn-in junction temperature distribution, respectively. Again, the mean temperature after implementation is higher and the standard deviation is smaller. As can be seen the actual temperature distribution tightens up and increases considerably in FIG. 4b. This would result in an approximate 20–30% reduction in burn-in stress cost and duration. The stress duration and cost reduces as the change in temperature between burn-in stress and use conditions increase. In this example, the mean junction temperature increases 5° C. This reduces the amount of time a component must be burned in.

Similarly, devices are profiled for power consumption and burn-in temperature depending upon their power characteristics. Typically, devices having the same general profile are burned in together. By controlling the power distribution of the devices, more devices can be 'programmed' to a particular power level, allowing more devices to be burned in simultaneously, reducing the overall cost of a production run for a particular component.

Similar to the application of embodiments of the invention to control burn-in power distributions, embodiments of the invention can be used to tighten the power distribution of devices under normal use conditions. This allows platform manufacturers to have 'good' samples of the component to validate their platforms.

Figure 5A:
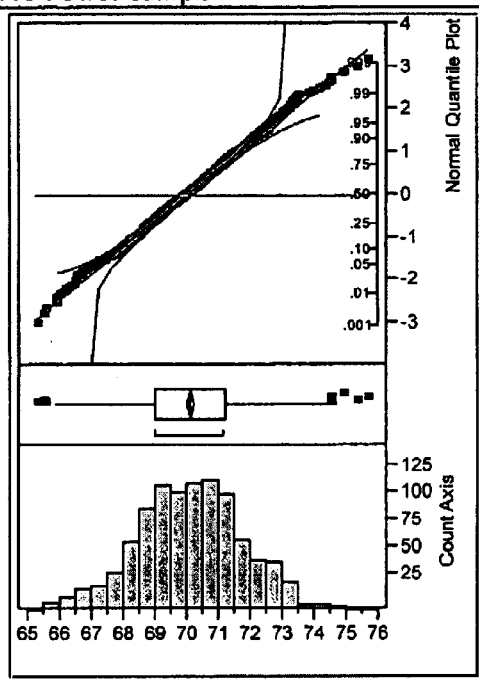
FIGS. 5a and 5b show simulated results of microprocessor power consumption prior to enabling a power adjustor and after enabling a power adjustor.

Typically, platform manufacturers may receive samples from the component manufacturers that have a range of power consumption profiles, due to variations in microelectronic materials and manufacturing processes. For example, a platform manufacturer may receive a sample of a microprocessor with a power of 70 Watts for its mean, median power, as is shown in FIG. 5a. The datasheet specification may be 75 W. Given a choice between trying to validate and verify the electrical and thermal characteristics of a component with a theoretical value and performing that validation with an actual component that has a lower value, most platform manufacturers will use the actual component.

Figure 5B:
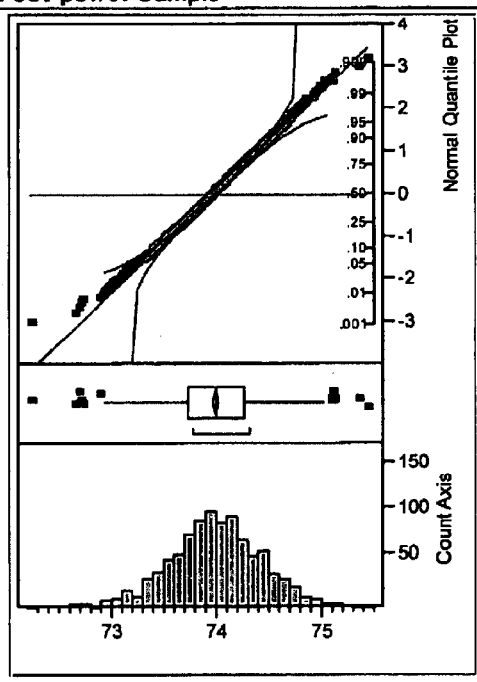

However, this may lead to problems. As the components are produced in typical manufacturing runs, the platform manufacturer may receive microprocessors that consume 75 W, increasing the temperature and the power needed for the platform. This may cause other components to fail, and represents a quality risk for both the platform and the component manufacturer. An example of the power distribution for normal use prior to using and adjustor circuit is shown in FIG. 5a. Looking at the bar graph at the bottom of the drawing, it can be seen that the power distribution in FIG. 5b is much tighter than that in FIG. 5a. Using embodiments of this invention, the simulated power distribution becomes that shown in FIG. 5b, which alleviates this problem.

Figure 6:
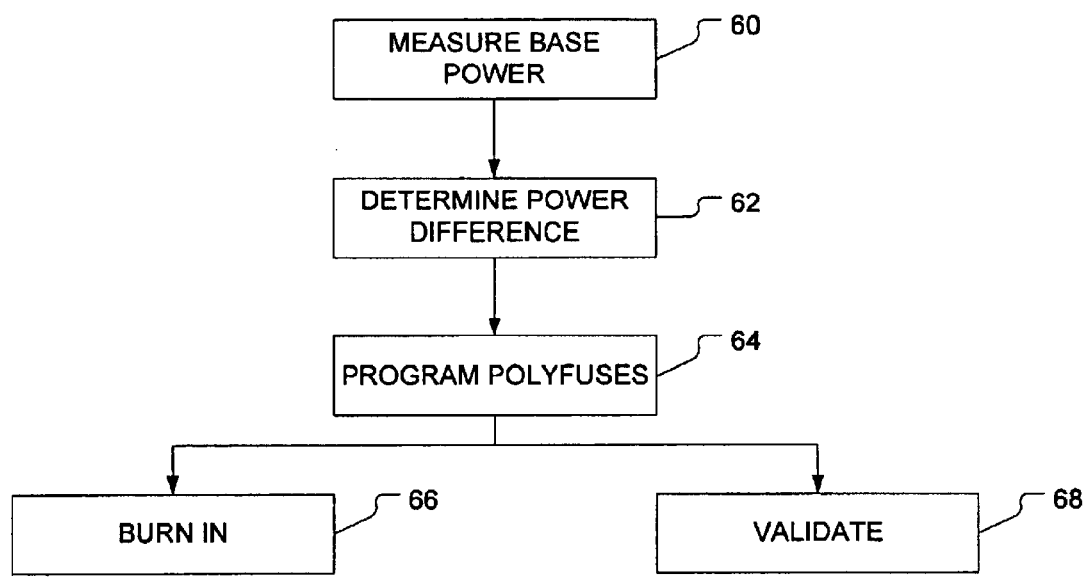
FIG. 6 shows an embodiment of a method to adjust power in an integrated circuit.

Employing embodiments of the invention, then it is possible to measure the power level of the component and then adjust the power up to the datasheet specification, or to the desired burn-in power. An embodiment of a method to control the power consumption of a component is shown in FIG. 6.

At 60, the base power distribution of the device, prior to enabling any power adjustment, is measured. The power difference between the predetermined, desired power level and the base power level is determined at 62. At 64, a number of polyfuses are blown to adjust the power by an amount substantially equal to the power difference. The device may then be either burned in at 66 or used for validation at 68. These last processes are optional and only shown for completeness. In the case of burn-in, the predetermined power level is the desired power level for burn-in cycling. In the case of validation, the predetermined power level is the specified power level on the component data sheet.

Thus, although there has been described to this point a particular embodiment for a method and apparatus for programmable power adjustment in microelectronic devices, it is not intended that such specific references be considered as limitations upon the scope of this invention except in-so-far as set forth in the following claims.

What is claimed is:

1. A circuit, comprising:
    at least one pass gate; and
    a power adjustor electrically coupled to each pass gate such that the power adjustor consumes power at a predetermined level when the pass gate is enabled, the power adjuster further comprising:
        transistor having a gate; and
        a polyfuse electrically coupled between the gate of the transistor and a ground state.

2. The circuit of claim 1 the pass gate further comprising two transistors configured in a mirror configuration and a resistor electrically coupled between the two transistors and a voltage source.

3. The circuit of claim 1 wherein the pass gate is electrically coupled to an enable signal.

4. The circuit of claim 1 the transistor further comprising an NMOS transistor having a width.

5. The circuit of claim 4 wherein the width depends upon power consumption for a process technology.

6. The circuit of claim 1 wherein at least one pass gate further comprises multiple pass gates and multiple power adjustors.

7. The circuit of claim 3 the circuit further comprising a fuse array to control the enable signal.

8. The circuit of claim 3 the circuit further comprising a configuration register to control the enable signal.

9. A system, comprising:
a control device to generate an enable signal;
a device under test having at least one power adjustment circuit to receive the enable signal from the control device causing the power adjustment circuit to operate, wherein the control device controls the device under test.

10. The system of claim 9 the device under test further comprising a power adjustment circuit for burn-in and a power adjustment circuit for validation.

11. The system of claim 9 the system further comprising a control register to store a state of an enable signal.

12. The system of claim 9 the system further comprising a fuse array to determine a state of an enable signal.

13. A method, comprising:
measuring a base power level;
determining a power difference between the base power level and a predetermined power level; and
programming a number of polyfuses on a device, wherein the polyfuses are electrically coupled to power adjustors, causing the device to consume power at a level substantially equal to the predetermined level.

14. The method of claim 13 further comprising burning in the device at the predetermined level of power.

15. The method of claim 13 wherein the predetermined level is a specified power level for the device.

16. The method of claim 15 the method further comprising performing platform validation with the device operating at a power level substantially equal to the specified power level for the device.

* * * * *